(12) United States Patent
Kim et al.

(10) Patent No.: US 7,096,914 B2
(45) Date of Patent: Aug. 29, 2006

(54) APPARATUS FOR BONDING A CHIP USING AN INSULATING ADHESIVE TAPE

(75) Inventors: Dong-Kuk Kim, Kyungki-do (KR); Min-Il Kim, Chungcheongnam-do (KR); Sang-Yeop Lee, Chungcheongnam-do (KR); Chang-Cheol Lee, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 74 days.

(21) Appl. No.: 10/629,937

(22) Filed: Jul. 29, 2003

(65) Prior Publication Data

US 2004/0031570 A1   Feb. 19, 2004

(30) Foreign Application Priority Data

Aug. 14, 2002   (KR) ............................... 2002-48094

(51) Int. Cl.
*H01L 21/44* (2006.01)

(52) U.S. Cl. ................. 156/521; 156/559; 156/566; 156/264; 438/118; 29/25.01; 29/738; 29/742; 29/759

(58) Field of Classification Search ............... 156/521, 156/559, 264, 299, 566; 438/118; 29/25.01, 29/738, 742, 759
See application file for complete search history.

(56) References Cited

U.S. PATENT DOCUMENTS

| | | | | |
|---|---|---|---|---|
| 5,431,767 A | * | 7/1995 | Koza et al. | 156/350 |
| 6,742,561 B1 | * | 6/2004 | Nam et al. | 156/521 |
| 2001/0005953 A1 | | 7/2001 | Tandy | |
| 2004/0108582 A1 | * | 6/2004 | Kim et al. | 257/678 |

FOREIGN PATENT DOCUMENTS

| JP | 04-365337 | 12/1992 |
|---|---|---|
| KR | 1020000014967 | 3/2000 |

OTHER PUBLICATIONS

English Abstract of Korean Publication No. 1020000014967.
English Abstract of Japanese Publication No. 04-365337.

* cited by examiner

*Primary Examiner*—Linda Gray
(74) *Attorney, Agent, or Firm*—Marger Johnson & McCollom, P.C.

(57) ABSTRACT

In an embodiment of the invention an apparatus is configured to stack a plurality of semiconductor chips having the same or similar size. The apparatus includes a tape providing unit for providing an insulating adhesive tape, a tape attaching device for attaching the insulating adhesive tape to an area between electrode pads of a first chip, and a chip attaching device for attaching a second chip to the insulating adhesive tape.

19 Claims, 5 Drawing Sheets

APPARATUS FOR BONDING A CHIP USING AN INSULATING ADHESIVE TAPE

RELATED APPLICATION

This application claims priority from Korean Patent Application No. 2002-48094 filed on Aug. 14, 2002, the contents of which are incorporated herein by reference in their entirety.

BACKGROUND OF THE INVENTION

1. Field of the Invention

The present invention relates to a semiconductor device manufacturing apparatus and, more particularly, to an apparatus for stacking a plurality of semiconductor chips having the same or similar size.

2. Description of the Related Art

A chip bonding process is generally a process for attaching a semiconductor chip to a substrate such as a lead frame or a printed circuit board. Conventionally, an adhesive means used in the chip bonding process comprises a conductive liquid adhesive such as Ag-epoxy, Ag-glass or solder, or an insulating liquid adhesive such as epoxy or silicone. A predetermined amount of the liquid adhesive is applied on the substrate. The semiconductor chip is placed on and pressed down on the liquid adhesive.

The conventional die bonding method using such liquid adhesive has several disadvantages. For example, it is difficult to control the thickness of the liquid adhesive. If a thin semiconductor chip, e.g. having a thickness of 180 μm or less, is used, voids may be generated in the liquid adhesive due to the warpage of the semiconductor chip. Such voids may reduce the reliability of the semiconductor device. Also, if the semiconductor chips are stacked in a three-dimensional arrangement, the rolling defect of the liquid adhesive may make the stacking of semiconductor chips having the same or similar size difficult.

SUMMARY OF THE INVENTION

In one embodiment, an apparatus for bonding a chip comprises means for providing a substrate including a first chip having electrodes; a tape providing unit for providing an insulating adhesive tape; a tape attaching device for attaching the insulating adhesive tape to an area between the electrode pads of the first chip; and a chip attaching device for attaching a second chip to the insulating adhesive tape.

Preferably, an apparatus for bonding a chip using an insulating adhesive tape includes substrate cassette containing a plurality of substrates. Each substrate has a first chip of edge-pad-type or peripheral-pad-type. Electrode pads may be disposed along the periphery of the first chip and wire-bonded to the substrate. A substrate conveyor unit may be located at one end near the substrate cassette and be operated to convey the substrate at a predetermined interval. A tape providing unit may be operable to provide an insulating adhesive tape. A tape attaching device may be operable to attach the insulating adhesive tape on an area between the electrode pads of the first chip. A wafer table may be operated to provide a wafer having second chips of the same or similar size to the first chip. A chip attaching device may be located between the wafer table and the substrate conveyor unit and be operated to separate the second chip from the wafer table and attach the second chip on the first chip.

In accordance with one aspect of the present invention, the tape providing unit may comprise a reel, on which the insulating adhesive tape is wound. A tape cutter may be operable to cut the insulating adhesive tape. Rollers may be operated to feed the tape cutter with the insulating adhesive tape. A tape adsorption device may be operated to support the insulating adhesive tape with vacuum force. A first tape holding device may be located at the upper portion of the tape adsorption device to engage the tape adsorption device. The first tape holding device may be operated to hold the insulating adhesive tape in position for cutting.

In accordance with another aspect of the present invention, the apparatus for bonding a chip further comprises a guide block and a second tape holding device. The guide block may be located at the lower surface of the insulating adhesive tape passing between the rollers and the tape cutter. The second tape holding device may engage the guide block and may be operated to hold the insulating adhesive tape in position for cutting.

In accordance with yet another aspect of the present invention, the apparatus for bonding a chip may further comprise a tape guide. The tape guide may be located in front of or in the rear of the rollers with respect to the traveling direction of the insulating adhesive tape. The tape guide may be operated to guide the movement of the insulating adhesive tape. The tape guide may have at least one guide groove corresponding to the width of the insulating adhesive tape. The depth of the guide groove may be greater than the thickness of the insulating adhesive tape. The clearance between the guide groove and the insulating adhesive tape edges may be formed within three times the maximum allowable tolerance in the width of the insulating adhesive tape.

Alternatively, the tape guide may comprise a guide plate and a guide adjust unit. The guide plate may be wider than the insulating adhesive tape. The guide plate may have at one end a step formed higher than the thickness of the insulating adhesive tape. The guide adjust unit may be installed at the guide plate and be operable to adjust the range of use of the guide plate to correspond to the width of the insulating adhesive tape.

In accordance with still another embodiment, the guide adjust unit may have at least one slot that penetrates the guide plate and is formed perpendicular to the step of the guide plate. The guide adjust unit may comprise a guide post, a guide block, and a guide block transfer means. The guide post may have one end protruding through the upper portion of the guide plate. The guide block, to which the other end of the guide post is fixed, may be located at the lower surface of the guide plate. The guide block transfer means may be connected to the guide block and be operated so as to horizontally move the guide post along the slot of the guide plate to place the insulating adhesive tape against the step of the guide plate.

In accordance with another embodiment, the tape adsorption device may be installed higher than the substrate conveyor unit. The tape attaching device may be installed directly above the substrate conveyor unit. The tape adsorption device adsorbing the insulating adhesive tape may move horizontally. The tape attaching device may move downward to adsorb the insulating adhesive tape of the tape adsorption device. The tape adsorption device may return to the original position. The tape attaching device may move further downward to attach the insulating adhesive tape on the area between the electrode pads of the first chip.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and, in which.

DETAILED DESCRIPTION

Embodiments of the present invention will be described below with reference to the accompanying drawings.

Figure 1:
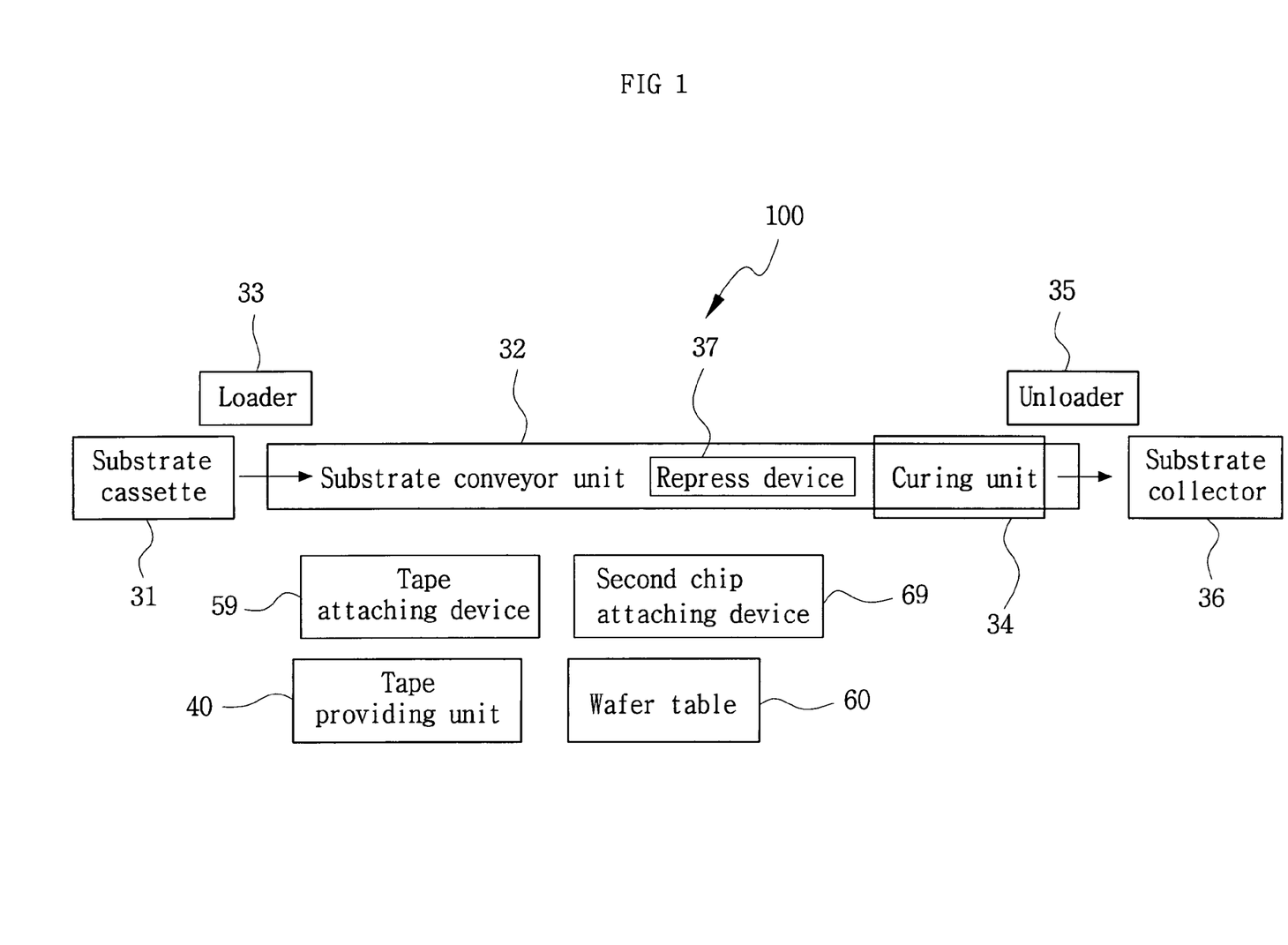
FIG. 1 is a simplified block diagram of an apparatus for bonding a chip in accordance with an embodiment of the present invention.

FIG. 1 is a simplified block diagram of an apparatus for bonding a chip 100 in accordance with one embodiment of the present invention. Referring to FIG. 1, an apparatus for bonding a chip 100 comprises a tape providing unit 40, a tape attaching device 59, a wafer table 60, a second chip attaching device 69, a repress device 37, and a curing unit 34 along a substrate conveyor unit 32. A first chip 12 (FIG. 2) is attached on a substrate 10. An insulating adhesive tape 20 is attached on the first chip 12. Other chips which are the same or similar in size to the first chip 12, may be attached on the insulating adhesive tape 20 continuously in a three-dimensional arrangement.

The apparatus for bonding a chip 100 may comprise a substrate cassette 31, a substrate conveyor unit 32 and a substrate collector 36. The substrate cassette 31 may be installed at one end of a substrate conveyor unit 32 and may contain a plurality of substrates having undergone a first chip attaching process and a wire-bonding process. One skilled in the art will appreciate that other suitable means for containing or providing substrates can be used instead of the substrate cassette 31. The substrate collector 36 may be installed at the other end of the substrate conveyor unit 32 and may contain a plurality of substrates after a chip stacking process. The substrate 10 may be a lead frame strip, a printed circuit board or a tape wiring substrate. Various substrate cassettes may be used according to the type of the substrate 10. The substrate cassette 31 containing the lead frame strips is generally referred to as a magazine. The substrates loaded in the substrate cassette 31 may be placed one by one onto the substrate conveyor unit 32 by a loader 33. The substrate conveyor unit 32 may convey the substrates at a predetermined interval during the chip attaching process. The substrate conveyor unit 32 may allow a continuous chip attaching process. The substrate conveyor unit 32 may use a conventional transfer system such as a transfer rail. Such system may be vertically installed at the underside of the substrate 10. After the chip stacking process, an unloader 35 may one by one transfer the substrate from the substrate conveyor unit 32 to the substrate collector 36.

A tape providing unit 40 may be operated to provide the insulating adhesive tape 20 for attachment of a second chip 16. A tape attaching device 59 may be located between the tape providing unit 40 and the substrate conveyor unit 32 and attach the insulating adhesive tape 20 on the first chip 12.

A wafer table 60 may provide a wafer including a second chip 16 which has the same or similar size to the first chip 12. A second chip attaching device 69 may be located between the wafer table 60 and the substrate conveyor unit 32. The second chip attaching device 69 may separate the second chip 16 from the wafer table 60 and attach the second chip 16 onto the insulating adhesive tape 20 of the first chip 12.

A repress device 37 may be installed at the upper portion of the substrate conveyor unit 32 and may be located in front of a curing unit 34. The repress device 37 may press the upper surface of the second chip 16 to secure the adhesion between the first chip 12, the insulating adhesive tape 20 and the second chip 16.

The curing unit 34 may be located near the end of the other side of the substrate conveyor unit 32 and to heat the insulating adhesive tape 20 between the first chip 12 and the second chip 16.

Figure 2:
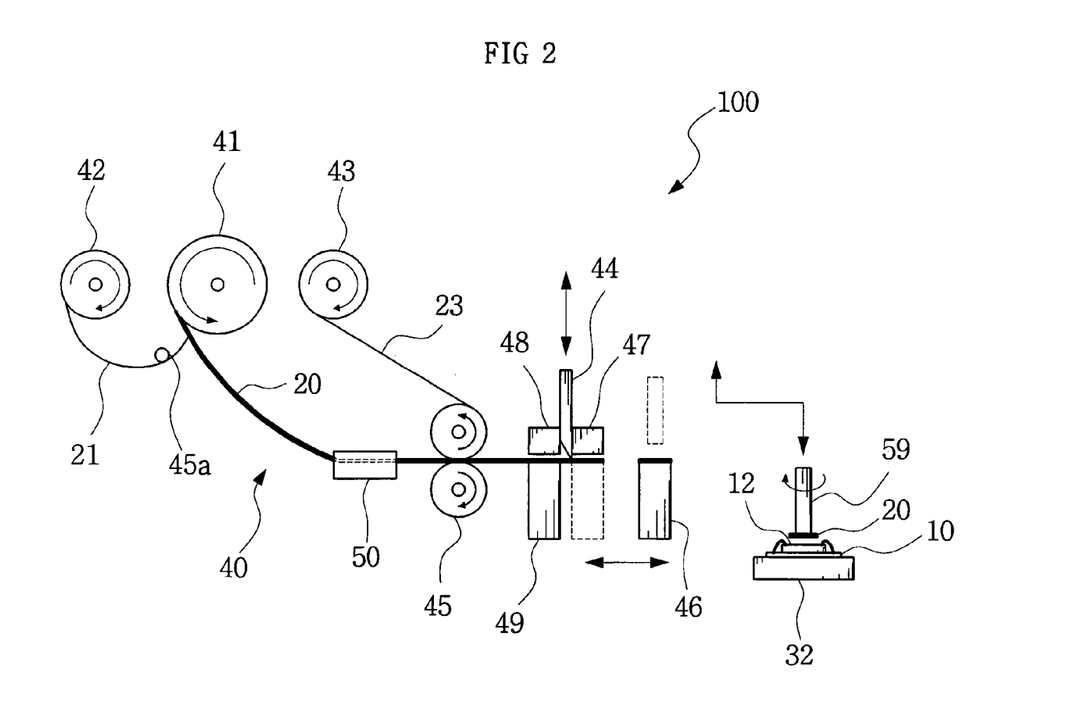
FIG. 2 is a view illustrating attachment of an insulating adhesive tape on a first chip in accordance with a first embodiment of the present invention.

Referring to FIG. 2, the substrate 10 has first chip 12 and is provided with the apparatus for bonding a chip 100. The first chip 12 is a so-called edge-pad-type or peripheral-pad-type chip. Electrode pads (14 of FIG. 5) are disposed along the periphery of the active surface of the first chip 12. The electrode pads 14 are electrically connected to the substrate 10 by, for example, bonding wires (15 of FIG. 5). The height of the wire loop of the bonding wires 15 above the active surface of the first chip 12 may be approximately 50μm or less.

The insulating adhesive tape 20 may be separately provided with the apparatus for bonding the chip 100. The insulating adhesive tape 20 may be an adhesive tape with both sides having an adhesive property. For example, the insulating adhesive tape 20 may have a three-layered structure, i.e., a core layer of polyimide sandwiched between two adhesive layers of polyimide. Alternatively, the insulating adhesive tape 20 may have only one adhesive layer of polyimide. The insulating adhesive tape 20 should be 50 μm thick or more to prevent interference between the bonding wires 15 and the second chip 16.

The insulating adhesive tape 20 may allow improved insulation and reliability while preventing void formation and rolling defect that may result from a liquid adhesive. Because the insulating adhesive tape 20 has no adhesive property at normal temperature, the insulating adhesive tape 20 is easy to handle at normal temperatures. However, once heat and pressure are applied to the insulating adhesive tape 20, its adhesive property activates.

After first chip attaching and bonding processes, the substrates 10 having first chip 12 are conveyed one by one by the substrate conveyor unit 32. The tape providing unit 40 which provides the insulating adhesive tape 20, may comprise a first reel 41 on which the insulating adhesive tape 20 is wound, a tape cutter 44 cutting the insulating adhesive tape 20, rollers 45 feeding the tape cutter 44 with the insulating adhesive tape 20, and a tape adsorption device 46 supporting the insulating adhesive tape 20 with vacuum force.

The tape providing unit 40 may further comprise a tape guide 50 and tape holding devices 47 and 48. The tape guide 50 may be operated so as to guide the movement of the insulating adhesive tape 20 such that the insulating adhesive tape 20 can be stably provided from the first reel 41 toward the tape cutter 44. The tape holding devices 47 and 48 hold the insulating adhesive tape 20 in position for cutting so that the insulating adhesive tape 20 can be stably cut by the tape cutter 44.

The insulating adhesive tape 20 is continuously fed from the first reel 41 to the tape cutter 44 through the rollers 45. The insulating adhesive tape 20 is cut by the tape cutter 44 such that it conforms with the size of the second chip 16.

Figure 5:
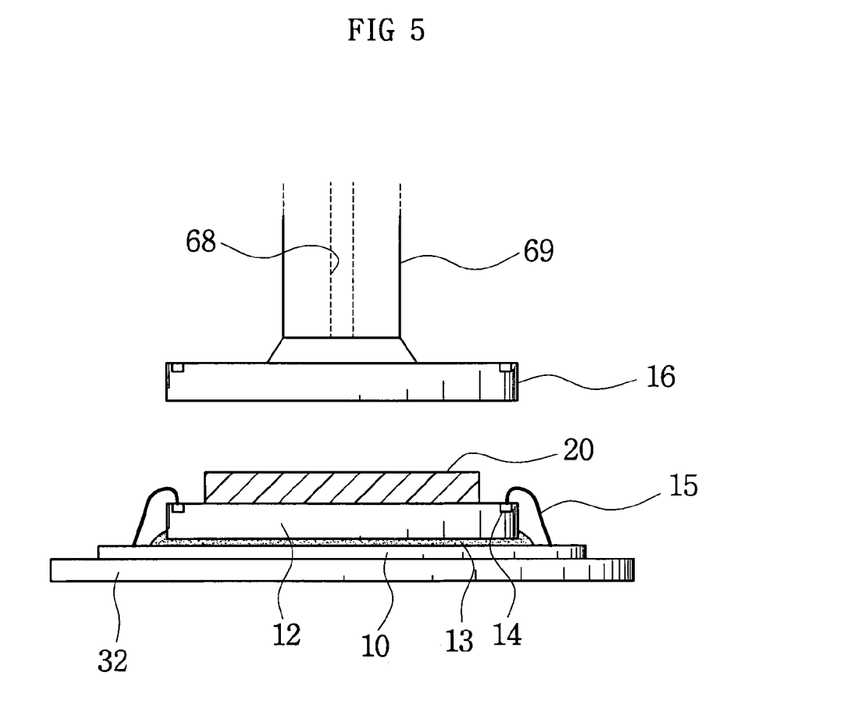
FIG. 5 is a view illustrating attachment of a second chip on the first chip.

As shown in FIG. 5, the insulating adhesive tape 20 is preferably smaller than the area between the electrode pads 14 of the first chip 12.

The use of the first reel 41 and the tape cutter 44 may allow the effective and continuous supply of the insulating adhesive tape 20 and may improve the productivity of the overall second chip attaching process. The length of the insulating adhesive tape 20 to be cut may be controllable by moving the tape cutter 44 in the tape direction. The width of the first reel 41 may be adjusted to conform with the width of the insulating adhesive tape 20.

The tape guide 50 guides the movement of the insulating adhesive tape 20 so that the insulating adhesive tape 20 can be stably provided from the first reel 41 to the tape cutter 44 through the rollers 45 without deviating or swaying from a predetermined position. In this embodiment, the tape guide 50 is installed between the first reel 41 and the rollers 45. The guide block 49 may be installed at the opposite side to the tape guide 50 relative to the rollers 45, i.e., between the rollers 45 and the tape adsorption device 46. The guide block 49 guides the supply of the insulating adhesive tape 20 to the tape adsorption device 46. The tape guide 50 and the guide block 49 may have their guiding surfaces parallel to the edges of the tape 20.

Figure 3A:
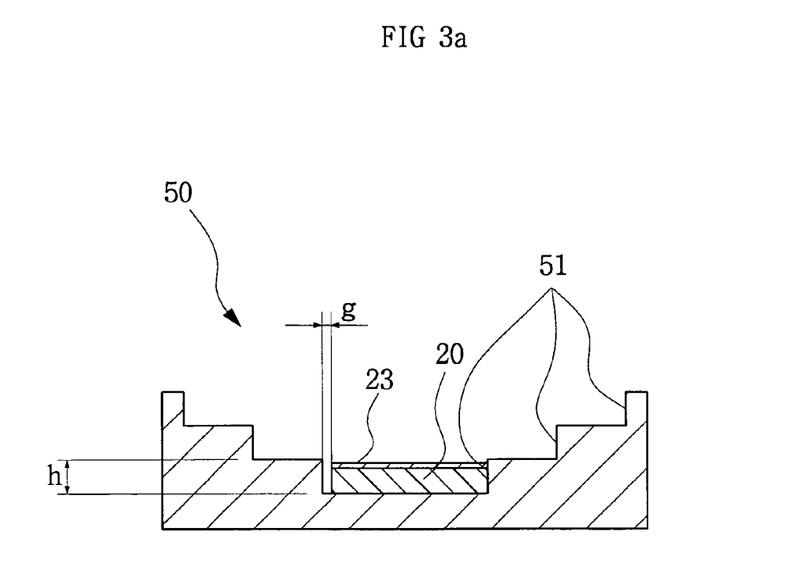
FIG. 3a is a cross-sectional view of a tape guide of FIG. 2, illustrating one example of the insulating adhesive tape having the smallest width.
Figure 3B:
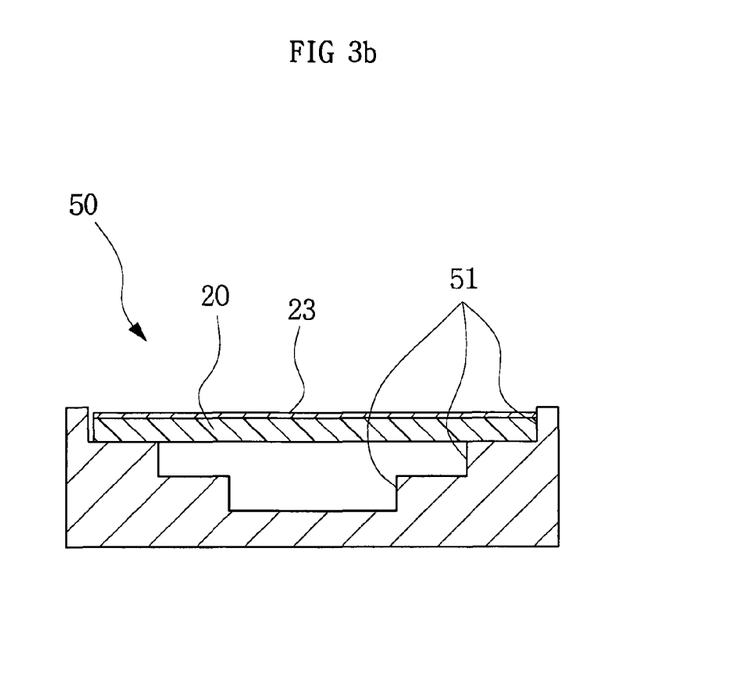
FIG. 3b is a cross-sectional view of the tape guide of FIG. 2, illustrating another example of the insulating adhesive tape having the largest width.

The tape guide 50 may have guide grooves 51 formed corresponding to the width of the insulating adhesive tape 20, as shown in FIGS. 3a and 3b. To reduce the number of the replacement tape guides 50, a tape guide 50 may have at least two guide grooves 51 formed in a stepped configuration to guide at least two insulating adhesive tapes 20 having different widths. The depth of the tape guide 50 may be greater than the thickness of the insulating adhesive tape 20 and the width of the tape guide 50 may correspond to the width of the insulating adhesive tape 20 for smooth movement of the insulating adhesive tape 20. To prevent the insulating adhesive tape 20 from swaying, the clearance (g) between the guide groove 51 and the edge of the insulating adhesive tape 20 may be within three times the maximum allowable tolerance in the width of the insulating adhesive tape 20. For example, if the allowable tolerance in the width of the insulating adhesive tape 20 is ±50 µm, the clearance (g) should be between 0 µm and 150 µm. If the clearance (g) is over three times the maximum allowable tolerance in the width of the insulating adhesive tape 20, the smooth movement of the insulating adhesive tape 20 may not be guaranteed.

In accordance with an embodiment of the present invention, the tape guide 50 has three guide grooves 51 formed stepped downward. FIG. 3a illustrates the tape guide 50 guiding the insulating adhesive tape 20 having the smallest width acceptable to the tape guide 50. FIG. 3b illustrates that tape guide 50 guiding the insulating adhesive tape 20 having the largest width acceptable to the tape guide 50.

Figure 4A:
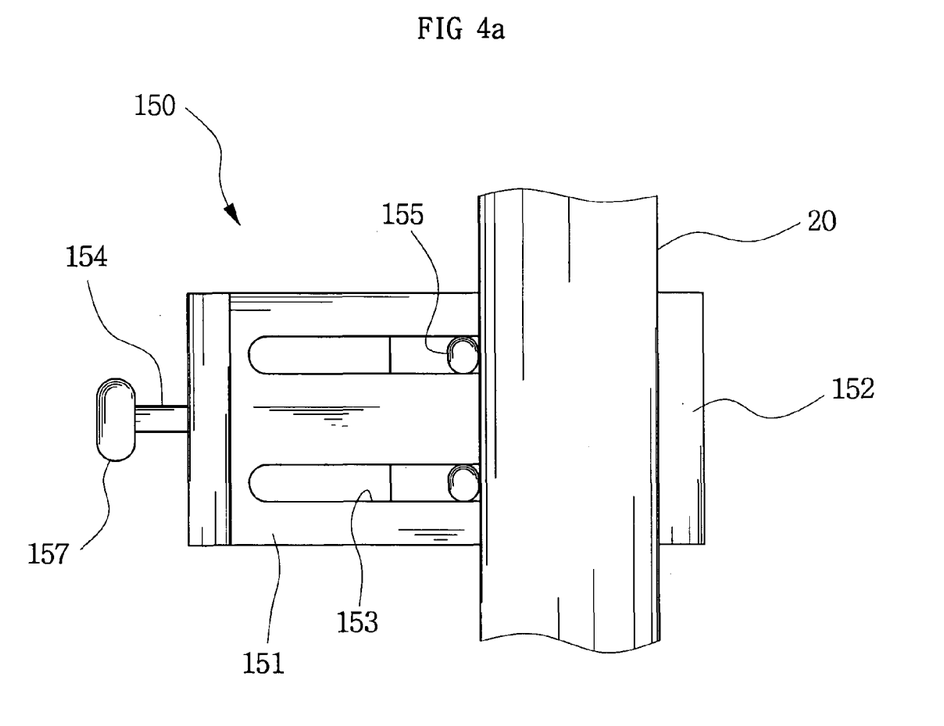
FIG. 4a is a plan view of one example of the tape guide of FIG. 2.
Figure 4B:
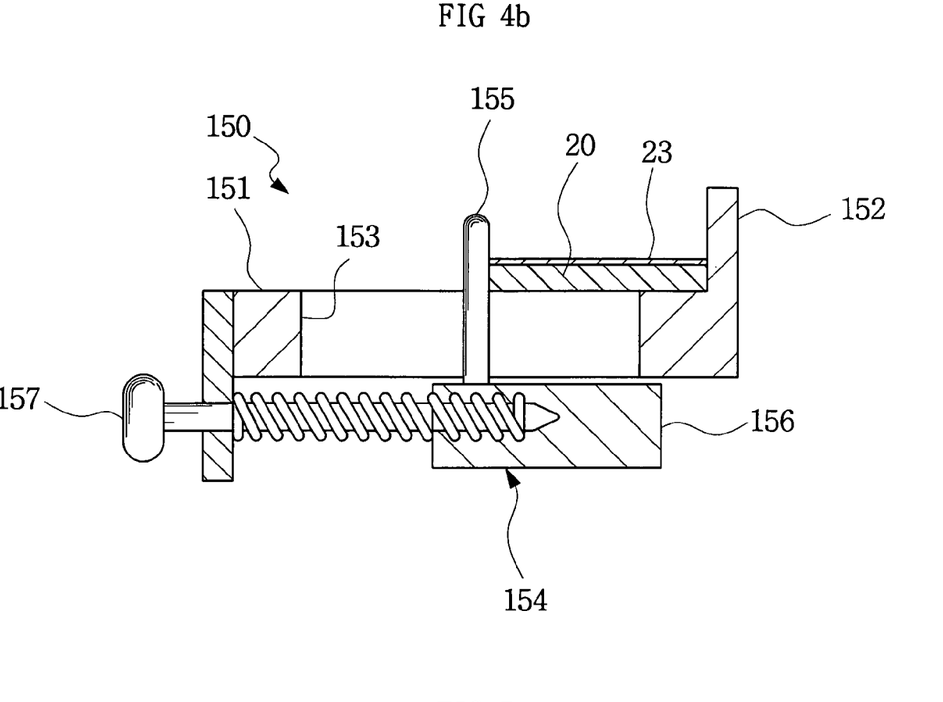
FIG. 4b is a cross-sectional view of another example of the tape guide of FIG. 2.

Alternatively, the tape guide 150 may be formed as shown in FIGS. 4a and 4b. The tape guide 150 may comprise a guide plate 151 and a guide adjust unit 154. The guide plate 151 is formed wider than the insulating adhesive tape 20 and has at one end a step 152 formed higher than the thickness of the insulating adhesive tape 20. The guide adjust unit 154 is formed at the guide plate 151 and adjusts the range of use of the guide plate 151 corresponding to the width of the insulating adhesive tape 20. The guide adjust unit 154 may have at least one slot 153 that penetrates the guide plate 151 and that is formed perpendicular to the step of the guide plate 151. The guide adjust unit 154 includes a guide post 155, a guide block 156 and a guide block transfer means 157. The guide post 155 has one end protruding through the upper portion of the guide plate 151. The guide block 156, to which the other end of the guide post 155 is fixed, is located at the lower surface of the guide plate 151. The guide block transfer means 157 is connected to the guide block 156 and is operated to horizontally move the guide post 155 along the slot 153 of the guide plate 151 to place the insulating adhesive tape 20 against the step 152 of the guide plate 151. Although this embodiment illustrates a screw type guide block transfer means, other devices such as a motor type guide block transfer plate may be used for this purpose. The guide post 155 protruding through the upper portion of the guide plate 151 may protrude higher than the thickness of the insulating adhesive tape 20 for a stable movement of the insulating adhesive tape 20.

The tape holding devices 47 and 48 hold the insulating adhesive tape 20 for a stable cutting operation. In the first embodiment of the present invention, the tape holding devices 47 and 48 are installed at the upper portion of the tape adsorption device 46. The tape holding devices 47 and 48 comprise a first tape holding device 47 to engage with the tape adsorption device 46 and a second tape holding device 48 to engage with the guide block 49. The insulating adhesive tape 20 is fed from the first reel 41 to the tape adsorption device 46 by the rollers 45 under the guidance of the tape guide 50. The insulating adhesive tape 20 is positioned such that the first and second tape holding devices 47 and 48 engage with the tape adsorption device 46 and the guide block 49, respectively. The insulating adhesive tape 20 is cut by the tape cutter 44.

The insulating adhesive tape 20 may have cover films formed on either or both sides thereof. If the insulating adhesive tape 20 has cover films 21 and 23 formed on both sides thereof, reels 42 and 43 are required to separate the cover films 21 and 23 from the insulating adhesive tape 20 and wind the cover films 21 and 23, before the insulating adhesive tape 20 is cut. The first embodiment of the present invention shows the insulating adhesive tape 20 having a lower cover film 21 and an upper cover film 23. A second reel 42 and a third reel 43 are installed on either side of a first reel 41. The second reel 42 winds the lower cover film 21. The third reel 43 winds the upper cover film 23. The lower cover film 21 is separated from the insulating adhesive tape 20 by an auxiliary roller 45a and is wound on the second reel 42 before the insulating adhesive tape 20 passes between the rollers 45. The upper cover film 23 is separated from the insulating adhesive tape 20 during passing between the rollers 45 and is wound on the third reel 43. When the insulating adhesive tape 20 is cut at a predetermined size, the tape attaching device 59 attaches the insulating adhesive tape 20 on the first chip 12. The tape attaching device 59 is located between the tape adsorption device 46 and the substrate conveyor unit 32 and reciprocates between the tape adsorption device 46 and the substrate 10 on the substrate conveyor unit 32. The tape attaching device 59 adsorbs the insulating adhesive tape 20 supported on the tape adsorption device 46 and transfers the insulating adhesive tape 20 to the substrate 10 on the substrate conveyor unit 32. The tape attaching device 59 further presses down and attaches the insulating adhesive tape 20 on the first chip 12. The tape attaching device 59 adsorbs the insulating adhesive tape 20 with vacuum force, in the same way as the tape adsorption device 46. The tape attaching device 59 approaches the upper portion of the insulating adhesive tape 20 supported on the tape adsorption device 46. The tape attaching device 59 provides vacuum force through a vacuum hole therein. At the same time, the tape adsorption device 46 stops providing vacuum force through the vacuum hole therein. Therefore, the insulating adhesive tape 20 is transferred from the tape adsorption device 46 to the tape attaching device 59 and is adsorbed by the tape attaching device 59. When the tape adsorption device 46 moves to the lower portion of the tape attaching device 59, the tape attaching device 59 moves downward to adsorb the insulating adhesive tape 20 on the tape adsorption device 46. The tape adsorption device 46 then returns to its original position. The tape attaching device 59 moves to the upper portion of the first chip 12 of the substrate 10 and presses down the insulating adhesive tape 20 on the area between the electrode pads (14 of FIG. 5) of the first chip 12. The tape attaching device 59 may be rotatable through 90 degrees to change the XY orientation of the insulating adhesive tape 20.

As described above, the adhesive property of the insulating adhesive tape is activated under predetermined temperature and pressure. Heat is applied to the substrate 10 through the substrate conveyor unit 32. Pressure is directly applied to the insulating adhesive tape 20 by the tape attaching device 59. For example, a process for attaching the insulating adhesive tape 20 can be performed under conditions of up to 400° C., pressure of 100 to 3,000 gf mm$^2$ and for a period of 10 milliseconds to 10 seconds.

The end of the tape attaching device 59 may use a high temperature rubber collet having fine vacuum holes formed over the lower surface. The fine vacuum holes may prevent inner voids, which could be formed when the insulating adhesive tape 20 is attached on the first chip 12. The high temperature rubber collet may not cause damage or deformation to the insulating adhesive tape 20 while it undergoes a high temperature of 400° C. or more. Referring to FIGS. 1 and 5, the chip attaching device 69 attaches a second chip 16 on the insulating adhesive tape 20 of the first chip 12. The second chip 16 is provided on a wafer for the apparatus that bonds the chips 100. The wafer including the individual second chips 16 is placed on a wafer table 60. The chip attaching device 69 is located between the wafer table 60 and the substrate conveyor unit 32 and reciprocates between them. The chip attaching device 69 adsorbs the second chip 16 with vacuum force provided through the vacuum hole 68 therein to separate the second chip 16 from the wafer. The chip attaching device 69 places and presses down the second chip 16 on the insulating adhesive tape 20 of the first chip 12. The second chip 16 is attached on the insulating adhesive tape 20 under heat and pressure in the same or similar way as the insulating adhesive tape 20 is attached to the first chip 12.

Figure 6:
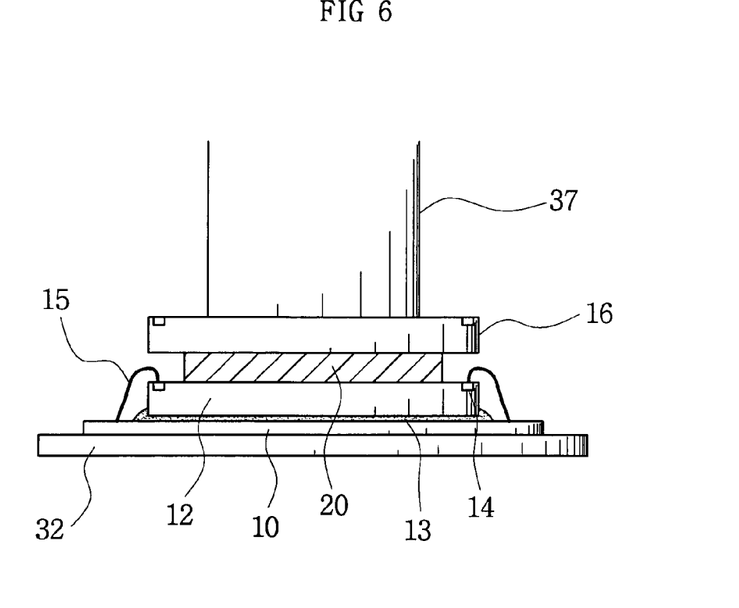
FIG. 6 is a view illustrating repress of the second chip.

Referring to FIGS. 1 and 6, a repress device 37 is located at the upper portion of the substrate conveyor unit 32 and presses the upper surface of the second chip 16. The second chip repressing process may improve the adhesion strength between the insulating adhesive tape 20 and the second chip 16 and prevent inner voids that may be generated between the insulating adhesive tape 20 and the second chip 16. The second chip repressing process is performed under the same or similar conditions as the process for attaching the insulating adhesive tape 20 on the first chip 12.

The curing unit 34 is located near the end of the other side of the substrate conveyor unit 32 as shown in FIGS. 1 and 6. The curing unit 34 is operated to heat the insulating adhesive tape 20 between the first chip 12 and the second chip 16. The curing process proceeds while the substrate 10 is conveyed on the substrate conveyor unit 32 before the substrate 10 is loaded into the substrate collector 36. The curing process is performed, for example, under a maximum temperature of about 600° C. Although this embodiment shows the use of the curing unit 34, the curing unit may not be required depending on the material properties of the insulating adhesive tape 20.

After the chip attaching process, the substrates 10 are discharged from the substrate conveyor unit 32 by the unloader 35 and are loaded one by one into the substrate collector unit 36.

Figure 7:
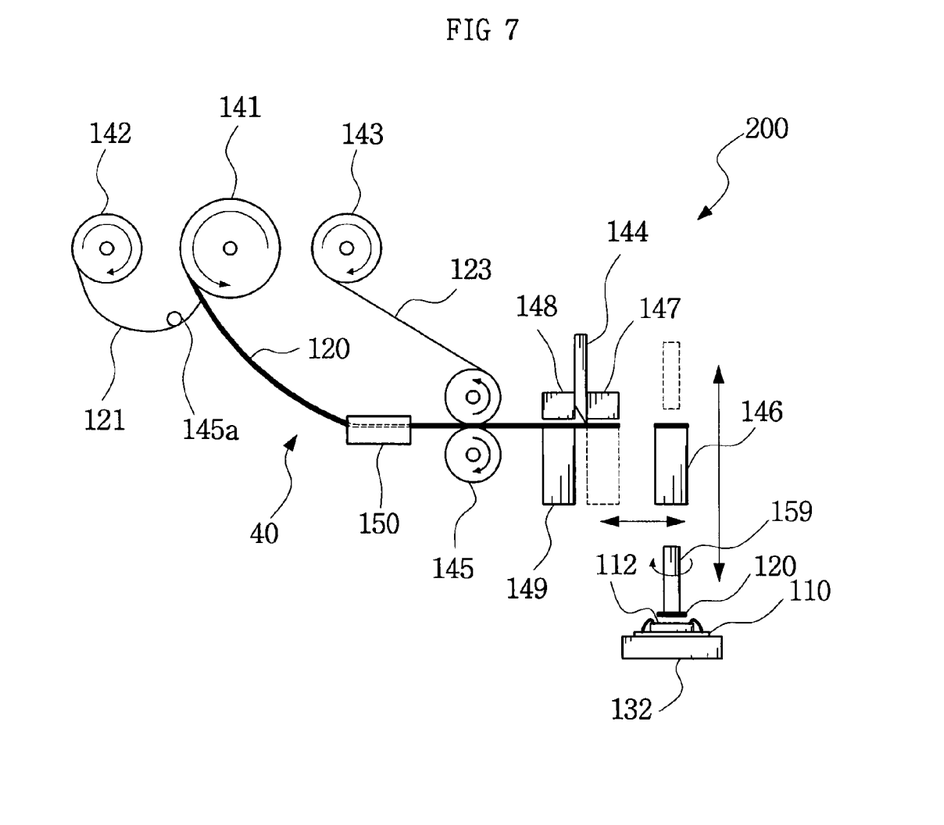
FIG. 7 is a view illustrating attachment of the insulating adhesive tape on the first chip in accordance with a second embodiment of the present invention.

FIG. 7 is a view illustrating attachment of the insulating adhesive tape 120 on the first chip 112 in accordance with a second embodiment of the present invention. Referring to FIG. 7, the tape adsorption device 146 is located at the upper portion of the substrate conveyor unit 132. Except for the location of the tape adsorption device 146, the chip bonding apparatus of the second embodiment (200 of FIG. 7) has the same structure as the first embodiment (100 of FIG. 2).

Such location of the tape adsorption device 146 and the tape attaching device 159 may improve adhesive precision of the insulating adhesive tape 120 and reduce the size of the apparatus for bonding a chip 200 and the operation time, thus improving productivity. The tape adsorption device 146 is installed directly above the substrate conveyor unit 132 so that the insulating adhesive tape 120 can be moved between the tape attaching device 159 and the substrate conveyor unit 132. The tape attaching device 159 is installed at the upper portion of the substrate conveyor unit 132 so that tape attaching device 159 can move downward to adsorb the insulating adhesive tape 120 on the tape adsorption device 146, and move further downward to attach the insulating adhesive tape 120 on the first chip 112 after the tape adsorption device 146 returns to an original position. The tape attaching device 159 is installed higher than the tape adsorption device 146 and reciprocates on the Z-axis.

The tape attaching device 159 of the second embodiment requires Z-axis movement only, which leads to improved adhesive precision, compared to that of the tape attaching device (59 of FIG. 2) of the first embodiment. Further, the second embodiment may eliminate the horizontal movement of the tape attaching device (59 of FIG. 2) of the first embodiment, thereby reducing the size and operation time of the apparatus for bonding a chip 200 and thus improving the productivity.

Accordingly, an apparatus for bonding a chip using an insulating adhesive tape 20 in accordance with the embodiments of the present invention may stack a plurality of semiconductor chips having the same or similar size in a 3-dimensional arrangement. The insulating adhesive tape 20 may be fed from the first reel 41 to the tape cutter 44 under guidance of the tape guide, which leads to stable supply of the insulating adhesive tape 20 without deviating or swaying from a predetermined travel course.

The insulating adhesive tape 20 is positioned such that the tape adsorption device 46 and the guide block 49 engage or are aligned with the first and second tape holding devices 47, 48, respectively. The tape adsorption device 46 and the guide block 49 are located on either side of the tape cutter 44. The tape cutter 44 can then stably cut the insulating adhesive tape 20.

Although the embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. An apparatus for bonding a chip, comprising:
   a substrate cassette containing a plurality of substrates, the substrate including a first chip, the substrate being electrically connected to electrode pads of the first chip;
   a substrate conveyor unit located near the substrate cassette at one end and for conveying the substrate;
   a tape providing unit for providing an insulating adhesive tape, the tape providing unit including:
      a reel on which the insulating adhesive tape is wound;
      a tape cutter for cutting the insulating adhesive tape;
      rollers for feeding the insulating adhesive tape from the reel to the tape cutter;
      a tape adsorption device for adsorbing the insulating adhesive tape to support the insulating adhesive tape; and
      a first tape holding device for engaging with the tape adsorption device to hold the insulating adhesive tape in position for cutting;
   a tape attaching device located between the tape providing unit and the substrate conveyor and for attaching the insulating adhesive tape to an area between the electrode pads of the first chip;
   a wafer table providing a wafer including a second chip; and
   a chip attaching device located between the wafer table and the substrate conveyor unit for attaching the second chip to the insulating adhesive tape on the first chip.

2. The apparatus of claim 1, wherein the insulating adhesive tape is at least 50 μm thick.

3. The apparatus of claim 1, further comprising:
   a guide block installed at the lower surface of the insulating adhesive tape passing between the rollers and the tape cutter; and
   a second tape holding device installed at the upper portion of the guide block and engaging with the guide block to hold the insulating adhesive tape in position for cutting.

4. The apparatus of claim 1, further comprising:
   a tape guide installed in front of or in the rear of the rollers with respect to the traveling direction of the insulating adhesive tape and guiding the movement of the insulating adhesive tape.

5. The apparatus of claim 4, wherein the tape guide has at least one guide groove corresponding to the width of the insulating adhesive tape.

6. The apparatus of claim 5, wherein the depth of the guide groove is greater than the thickness of the insulating adhesive tape and the clearance between the guide groove and the insulating adhesive tape edges is within about three times the maximum allowable tolerance in the width of the insulating adhesive tape.

7. The apparatus of claim 4, wherein the tape guide comprises:
   a guide plate wider than the insulating adhesive tape and having at one end a step formed higher than the thickness of the insulating adhesive tape; and
   a guide adjust unit installed at the guide plate and adjusting the range of use of the guide plate corresponding to the width of the insulating adhesive tape, the guide adjust unit including:
      a guide post protruding through the upper portion of the guide plate and having at least one slot formed perpendicular to the step of the guide plate;
      a guide block located at the lower surface of the guide plate and connected to the other end of the guide post; and
      a guide block transfer means connected to the guide block and horizontally moving the guide past along the slot of the guide plate to place the insulating adhesive tape against the step of the guide plate.

8. The apparatus of claim 1, wherein the tape adsorption device is located higher than the substrate conveyor unit and the tape attaching device is located directly above the substrate conveyor unit,
   wherein the tape adsorption device adsorbing the insulating adhesive tape moves above the substrate conveyor unit and the tape attaching device moves downward and adsorbs the insulating adhesive tape of the tape adsorption device and then the tape adsorption device returns to an original position and the tape attaching device moves further downward to attach the insulating adhesive tape to the area between the electrode pads of the first chip.

9. The apparatus of claim 1, further comprising:
   a substrate collector located near an end of the other side of the substrate conveyor unit and loading the substrates having the second chip.

10. The apparatus of claim 9, further comprising:
    a repress device located between the chip attaching device and the substrate collector and repressing the second chip on the first chip,
    wherein the repress device represses under conditions of a normal temperature up to about 400° C., pressure of about 100 to 3,000 gf/mm$^2$ and dwell time for a period of about 10 milliseconds to 10 seconds.

11. The apparatus of claim 1, wherein the tape attaching device is rotatable through 90 degrees.

12. An apparatus for bonding a chip, comprising:
    means for providing a substrate including a first chip having electrode pads thereon;
    a tape providing unit for providing an insulating adhesive tape;
    a tape attaching device for attaching one side of the insulating adhesive tape to the first chip between the electrode pads of the first chip; and
    a chip attaching device for attaching a second chip to the other side of the insulating adhesive tape, wherein the tape attaching device is rotatable through an angle of 90 degrees to place the insulating adhesive tape onto the first chip with a variable orientation.

13. The apparatus of claim 12, wherein the tape providing unit comprises:
    a reel on which the insulating adhesive tape is wound;
    a tape cutter for cutting the insulating adhesive tape;
    rollers for feeding the insulating adhesive tape from the reel to the tape cutter;
    a tape adsorption device for adsorbing the insulating adhesive tape to support the insulating adhesive tape; and a first tape holding device for engaging with the tape adsorption device to hold the insulating adhesive tape in position for cutting.

14. The apparatus of claim 12, wherein the means for providing a substrate comprises a substrate cassette.

15. The apparatus of claim 14, further comprising a substrate conveyor unit located near the substrate cassette at one end and for conveying the substrate at a predetermined interval.

16. The apparatus of claim 15, wherein the tape attaching device is located between the tape providing unit and the substrate conveyor.

17. The apparatus of claim 15, further comprising a wafer table providing a wafer including the second chip.

18. The apparatus of claim 17, wherein the chip attaching device is located between the wafer table and the substrate conveyor unit.

19. An apparatus for bonding a chip comprising:

means for providing a substrate including a first chip having electrode pads thereon;

a tape providing unit for providing an insulating adhesive tape, wherein the insulating adhesive tape has a cover film on either or both sides before being attached to the first chip;

a tape attaching device for attaching one side of the insulating adhesive tape to the first chip between the electrode pads of the first chip;

a chip attaching device for attaching a second chip to the other side of the insulating adhesive tape; and reels to separate the cover film from the insulating adhesive tape.

* * * * *